United States Patent
Li et al.

(10) Patent No.: US 10,386,896 B2
(45) Date of Patent: Aug. 20, 2019

(54) WATER COOLING SYSTEM FOR A COMPUTER AND WATER COOLING CASE HAVING THE SAME

(71) Applicant: BEIJING DEEPCOOL INDUSTRIES CO., LTD., Haidian, Beijing (CN)

(72) Inventors: Weichao Li, Beijing (CN); Haibo Yu, Beijing (CN); Edward Xia, Beijing (CN); Lei Liu, Beijing (CN); Heng Li, Beijing (CN)

(73) Assignee: Beijing Deepcool Industries Co., Ltd., Beijing (CN)

( * ) Notice: Subject to any disclaimer, the term of this patent is extended or adjusted under 35 U.S.C. 154(b) by 0 days.

(21) Appl. No.: 15/768,611

(22) PCT Filed: Oct. 29, 2015

(86) PCT No.: PCT/CN2015/093151
§ 371 (c)(1),
(2) Date: Apr. 16, 2018

(87) PCT Pub. No.: WO2017/070875
PCT Pub. Date: May 4, 2017

(65) Prior Publication Data
US 2018/0299931 A1    Oct. 18, 2018

(51) Int. Cl.
*G06F 1/20* (2006.01)
*H05K 7/20* (2006.01)

(52) U.S. Cl.
CPC .......... *G06F 1/20* (2013.01); *H05K 7/20263* (2013.01); *H05K 7/20272* (2013.01); *G06F 2200/201* (2013.01)

(58) Field of Classification Search
CPC .... F01P 11/029; F01P 5/10; F01P 3/20; F01P 7/14; F01P 7/00; H05K 7/20263; H05K 7/20272; G06F 1/20; G06F 2200/201
(Continued)

(56) References Cited

U.S. PATENT DOCUMENTS

| | | | | |
|---|---|---|---|---|
| 8,564,951 | B1* | 10/2013 | Watanabe | H05K 7/20736 165/104.33 |
| 2007/0284094 | A1* | 12/2007 | Pawlak | G06F 1/20 165/122 |
| 2017/0034950 | A1* | 2/2017 | Sung | G06F 1/20 |

FOREIGN PATENT DOCUMENTS

| CN | 201215646 | 4/2009 |
|---|---|---|
| CN | 101443724 | 5/2009 |
| CN | 203520294 | 4/2014 |

OTHER PUBLICATIONS

International Search Report for PCT/CN2015/093151, dated Jul. 26, 2016, 5 pages.

* cited by examiner

*Primary Examiner* — Mandeep S Buttar
(74) *Attorney, Agent, or Firm* — Nixon & Vanderhye, P.C.

(57) ABSTRACT

The present invention discloses a water cooling system for a computer, which includes a radiator, a cooling block in fluid communication with the radiator, and a liquid storage tank in fluid communication with the radiator and the cooling block. The radiator, the cooling block and the liquid storage tank are of an integrated structure. The water cooling system of the invention has an integrated structure which does not require user to assemble the components, thereby avoiding incidents such as liquid leakage. The water cooling system is provided with the liquid storage tank that is at least partially exposed outside a water cooling case, thereby increasing the amount of a cooling liquid, improving the heat dissipating efficiency, enabling a user to easily observe the amount of the cooling liquid, and improving the appearance of the water cooling case.

17 Claims, 5 Drawing Sheets

(58) Field of Classification Search
USPC .......... 165/104.33, 80.2, 80.4, 80.5; 62/115;
361/679.47, 696, 698, 699, 701
See application file for complete search history.

WATER COOLING SYSTEM FOR A COMPUTER AND WATER COOLING CASE HAVING THE SAME

This application is the U.S. national phase of International Application No. PCT/CN2015/093151 filed Oct. 29, 2015, which designated the U.S., the entire content of which is hereby incorporated by reference.

FIELD OF INVENTION

The present invention relates to a computer, and in particular to a water cooling system for a computer and a water cooling computer case.

RELATED ART

Nowadays there are two types of water cooling systems used in computer cases appeared on the market. As shown in FIG. 1, one type is an integrated water cooling system which comprises a cooling block 1 (having a built-in water pump), a radiator 2, and at least one fan disposed on the radiator 2. The radiator 2 is provided therein with a water inlet passage 202 and a water outlet passage 201, which are in communication with each other, a water outlet of the cooling block is in fluid communication with the water inlet passage 202 of the radiator, and a water inlet of the cooling block is communicated with the water outlet passage 201 of the radiator. The cooling block is fixed on the outer side of a CPU of a computer and used for heat exchange with the CPU. The integrated water cooling system requires overall installation and replacement and is featured by convenient installation, low cost and low risk of liquid leakage; and does not need to empty a cooling liquid in the case of replacing computer hardware. However, such water cooling system provides a smaller amount for cooling liquid, has low heat dissipating efficiency, and disables the supply of supplementary cooling liquid.

The other type is a split-type water cooling system that comprises a radiator, a water pump, a liquid storage tank, a cooling block, a cooling liquid and accessories, these components are fixed by a user in the corresponding positions of a case, with pipes being disposed between the cooling block and the radiator and between the radiator and the liquid storage tank to form a fluid passage, then the cooling liquid is introduced into the fluid passage, accordingly, the installation of the split-type water cooling system is complex. A viewing window is formed on the case, through which the user may observe the amount of cooling liquid in the liquid storage tank. In the case of replacing CPU and other computer hardware, the cooling liquid is discharged and the pipes are removed, and after the computer hardware are replaced in place, the pipes are re-installed and then the cooling liquid is introduced. Although the user may select the components based on the practical need, the replacement of hardware is difficult, and the risk of liquid leakage is increased due to unreliable connection between the components.

The information disclosed in the art portion is merely made to improve the understanding of the overall background of the present invention, and not intended to admit or imply in any way that the information forms the state of the art as known to those skilled in the art.

SUMMARY OF THE INVENTION

An object of the present invention is to provide a water cooling system for a computer, which overcomes the problem that the existing water cooling system has a smaller amount of cooling liquid and has a high risk of liquid leakage.

To this end, according to an aspect, the present invention provides a water cooling system for a computer which includes a radiator, a cooling block in fluid communication with the radiator, and a liquid storage tank in fluid communication with the radiator and the cooling block. The radiator, the cooling block and the liquid storage tank are of an integrated structure.

Preferably, the liquid storage tank is provided with a water injection port.

Preferably, the cooling block comprises a first passage and a second passage which are isolated from each other. The first passage is in fluid communication with a water outlet of the cooling block and a water inlet of the liquid storage tank, and the second passage is in fluid communication with a water outlet of the liquid storage tank and a water inlet of the cooling block.

Preferably, the water cooling system further comprises a water pump which is fixed on the cooling block.

Preferably, the water cooling system further comprises a water pump which is fixed on the liquid storage tank.

Preferably, the water cooling system further comprises a water pump which is fixed on the radiator.

According to another aspect, the invention provides a water cooling case for a computer. A water cooling system is disposed on the water cooling case, and the water cooling system comprises a radiator fixed in the water cooling case, a cooling block in fluid communication with the radiator, and a liquid storage tank in fluid communication with the radiator and the cooling block, wherein the radiator, the cooling block and the liquid storage tank are of an integrated structure.

Preferably, the liquid storage tank is at least partially exposed outside the water cooling case.

Preferably, the liquid storage tank is provided thereon with a water injection port, and the water injection port is exposed outside the water cooling case.

Compared with the prior art, the water cooling system according to the present invention has the following benefits:

The water cooling system according to the present invention has an integrated structure which does not require user to assemble the components and avoids liquid leakage. The water cooling system is provided with a liquid storage tank that is at least partially exposed outside the water cooling case, which can increase the amount of cooling liquid and improve the heat dissipating efficiency and can also enable a user to easily observe the amount of cooling liquid and improve the appearance of the water cooling case; and the arrangement of the water injection port on the liquid storage tank is convenient for supplementing liquid.

DETAILED DESCRIPTION OF THE INVENTION

The embodiments of the present invention are described in details with reference to the accompanying drawings, but it should be understood that the scope of the present invention is not limited by these embodiments.

Unless defined otherwise, the term "comprises" or its variations (such as "containing" or "comprising") are considered to include elements recited or components thereof, and not intended to exclude other elements or components thereof.

Figure 1:
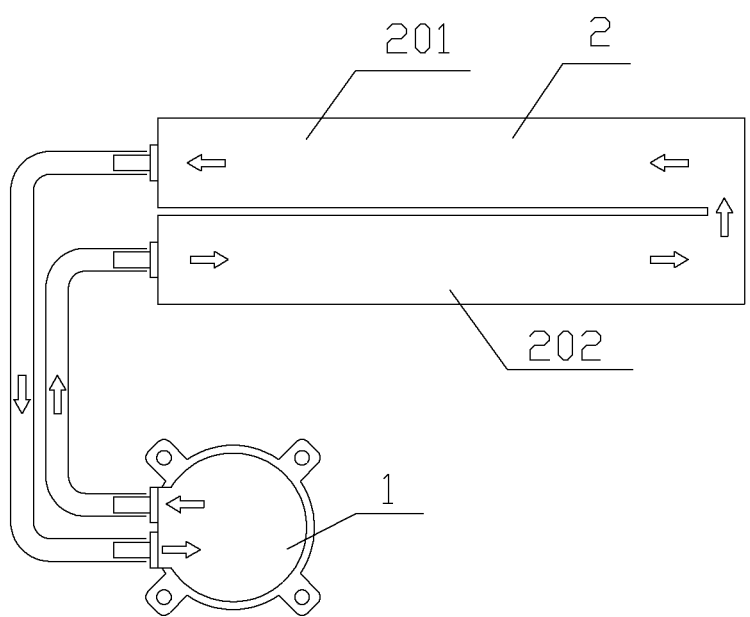
FIG. 1 is a schematic view of a fluid passage of an integrated water cooling system in the prior art.
Figure 2:
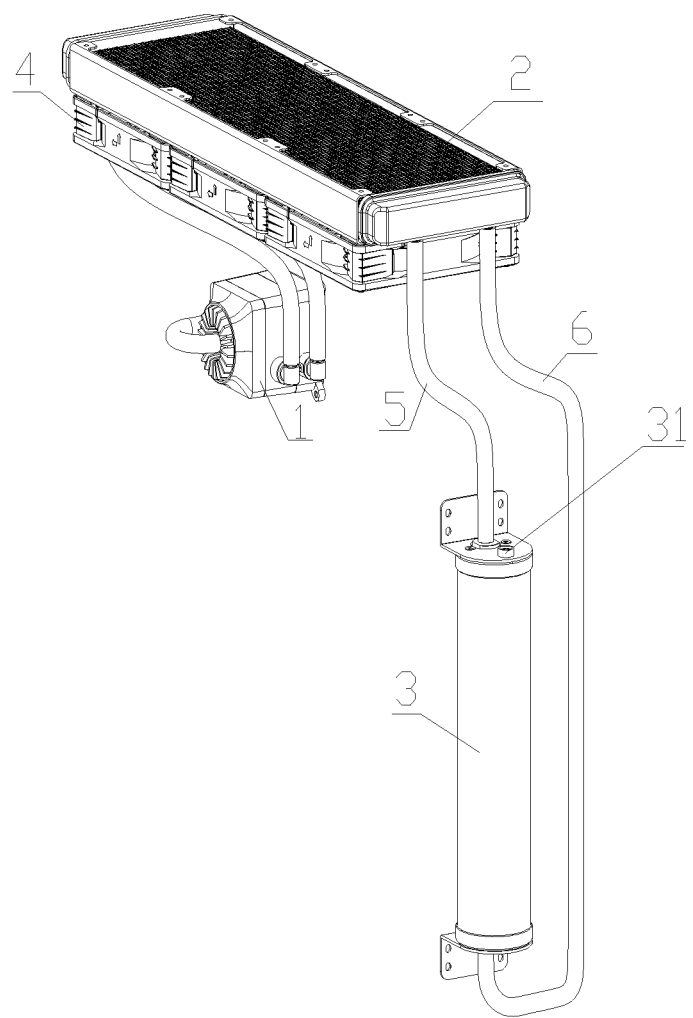
FIG. 2 is a structural view of a water cooling system for a computer in accordance with an embodiment of the present invention.
Figure 3:
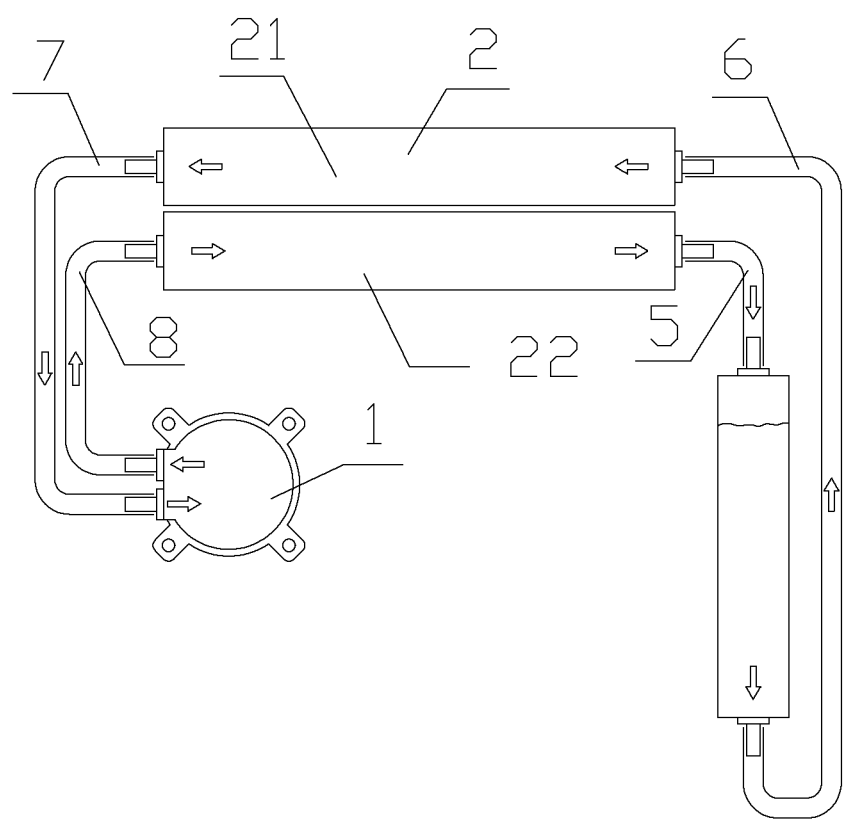
FIG. 3 is a schematic view of a fluid passage of a water cooling system for a computer in accordance with an embodiment of the present invention.

As shown in FIG. 2 to FIG. 3, a water cooling system for a computer, in accordance with an embodiment of the present invention, has an integrated structure which requires overall installation and replacement. The water cooling system comprises a cooling block 1, a radiator 2, a liquid storage tank 3, at least one fan 4 and a water pump (not shown), and the fan 4 is disposed on the radiator 2.

As shown in FIG. 3, the radiator 2 comprises a first passage 22 and a second passage 21, which are isolated from each other. The first passage 22 is in fluid communication with a water outlet of cooling block 1 via a fourth pipe 8, and in fluid communication with a water inlet of the liquid storage tank 3 via a first pipe 5. The second passage 21 is in fluid communication with a water outlet of liquid storage tank 3 via a second pipe 6, and in fluid communication with a water inlet of the cooling block 1 via a third pipe 7.

As an example shown in FIG. 2, the water pump is fixed on the cooling block 1. As another example, the water pump is fixed on the liquid storage tank 3. As yet another example, the water pump is fixed on the radiator 2. Preferably, the liquid storage tank 3 is provided thereon with a water injection port 31.

Figure 4:
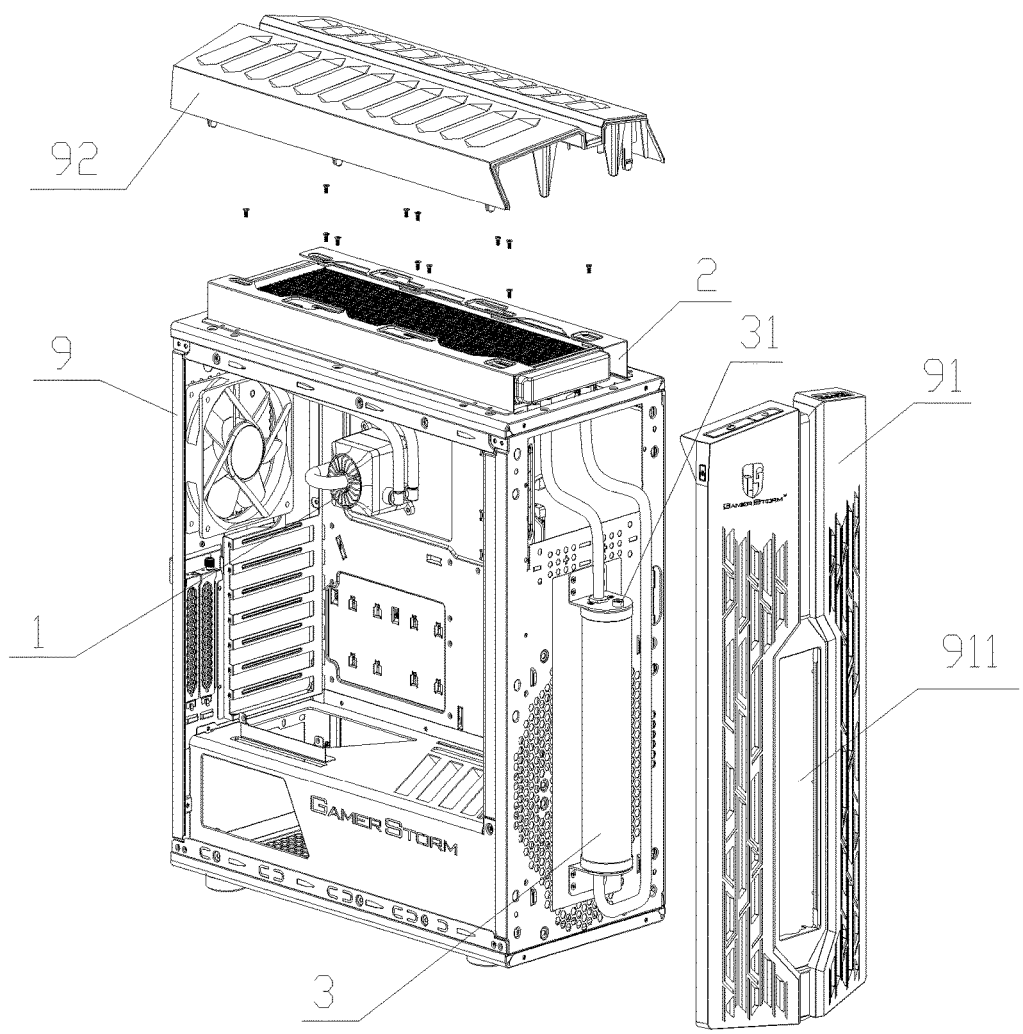
FIG. 4 is an exploded view of a water cooling system and a water cooling case for a computer in accordance with an embodiment of the present invention.
Figure 5:
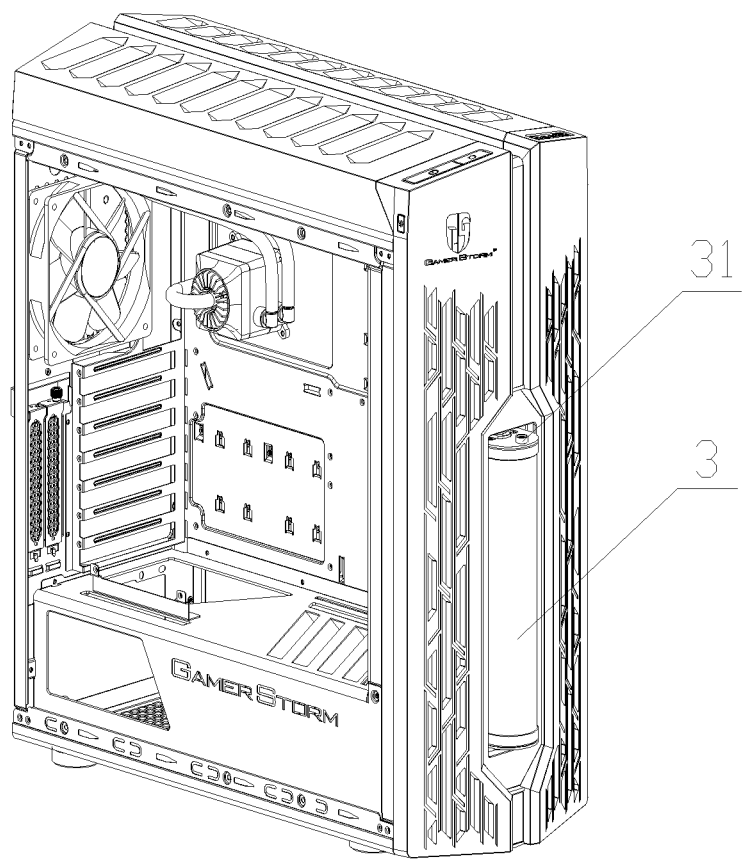
FIG. 5 is an assembled view of the water cooling system and the water cooling case for a computer in accordance with an embodiment of the present invention.

As shown in FIG. 4 and FIG. 5, the integral water cooling system is installed in a water cooling case 9. The radiator 2 is installed below a top plate 92 of the water cooling case 9. The cooling block 1 is fixed on the outer side of a CPU in the water cooling case 9, and the liquid storage tank 3 is adjacent to a side plate 91 of the water cooling case 9.

Preferably, the side plate 91 is provided thereon with a hole 911 in a position corresponding to the liquid storage tank 3, and the liquid storage tank at least partially extends through the hole 911 to be exposed outside the water cooling case 9. As an example, a part of the liquid storage tank 3 is exposed outside the water cooling case 9 and the other part is located within the water cooling case 9, as shown in FIG. 4 and FIG. 5. The water injection port 31 is located on the outer side of the water cooling case 9, which enables a user to easily observe the amount of cooling liquid and to supplement the cooling liquid in time.

As shown in FIG. 3, during the operation of the computer, the heat generated by the CPU is transferred to the cooling liquid in the cooling block 1, and the cooling liquid enters the second passage of the radiator via the fourth pipe 8, in which the cooling liquid is cooled to release a part of heat. Then, the cooling liquid enters the liquid storage tank 3 via the first pipe 5 for heat exchange with the cooling liquid in liquid storage tank 3. Subsequently, the cooling liquid enters the first passage 22 via the second pipe 6, in which the cooling liquid is cooled again. Finally, the cooling liquid returns to the cooling block 1 via the third pipe 7, the procedure repeats so that the cooling of the CPU is completed.

In the case of replacing the computer hardware, all that is needed is to remove the cooling block 1 from the CPU and then re-install the cooling block to the CPU after the replacement is completed, which is simple and convenient to operate.

The water cooling system of the invention has an integrated structure which does not require a user to assemble the components and avoids liquid leakage; the water cooling system is provided with the liquid storage tank that is at least partially exposed outside the water cooling case, which can increase the amount of cooling liquid and improve the heat dissipating efficiency, and can also enable a user to easily observe the amount of cooling liquid and improve the appearance of the water cooling case. Besides, the arrangement of the water injection port on the liquid storage tank is convenient for supplementing the liquid.

The foregoing description of the particular embodiments of the present invention is merely illustrative and exemplary. The description is not intended to limit the present invention to specific forms disclosed, and it is obvious that various variations and modifications can be made according to the teachings. The exemplary embodiments are selected and described to explain the particular principle and application of the present invention, so that those skilled in the art can implement and utilize different exemplary embodiments and different options and variations of the present invention. The scope of the present invention is intended to be defined by the following claims and equivalents thereof.

The invention claimed is:

1. A water cooling system for a computer, comprising:
a radiator;
a cooling block in fluid communication with the radiator; and
a liquid storage tank in fluid communication with the radiator and the cooling block, wherein
the radiator, the cooling block and the liquid storage tank are of an integrated structure, and
the radiator comprises a first passage and a second passage isolated from each other, wherein the first passage is in fluid communication with a water outlet of the cooling block and a water inlet of the liquid storage tank, and the second passage is in fluid communication with a water outlet of the liquid storage tank and a water inlet of the cooling block, such that during the operation of the computer, the cooling liquid firstly enters the second passage of the radiator in which the cooling liquid is cooled to release a part of heat, and then the cooling liquid enters the first passage in which the cooling liquid is cooled again.

2. The water cooling system for a computer according to claim 1, wherein the liquid storage tank is provided with a water injection port.

3. The water cooling system for a computer according to claim 1, further comprising a water pump which is fixed on the cooling block.

4. The water cooling system for a computer according to claim 1, further comprising a water pump which is fixed on the liquid storage tank.

5. The water cooling system for a computer according to claim 1, further comprising a water pump which is fixed on the radiator.

6. A water cooling case for a computer, wherein a water cooling system is installed on the water cooling case, the water cooling system comprising:

a radiator fixed in the water cooling case;

a cooling block in fluid communication with the radiator; and a liquid storage tank in fluid communication with the radiator and the cooling block, wherein the radiator, the cooling block and the liquid storage tank are of an integrated structure, and the radiator comprises a first passage and a second passage isolated from each other, wherein the first passage is in fluid communication with a water outlet of the cooling block and a water inlet of the liquid storage tank, and the second passage is in fluid communication with a water outlet of the liquid storage tank and a water inlet of the cooling block, such that during the operation of the computer, the cooling liquid firstly enters the second passage of the radiator in which the cooling liquid is cooled to release a part of heat, and then the cooling liquid enters the first passage in which the cooling liquid is cooled again.

7. The water cooling case for a computer according to claim 6, wherein the liquid storage tank is at least partially exposed outside the water cooling case.

8. The water cooling case for a computer according to claim 7, wherein the liquid storage tank is provided thereon with a water injection port which is exposed outside the water cooling case.

9. An integrated water cooling system for a computer case, comprising:

a radiator having a first passage and a second passage, the second passage separated from the first passage;

a cooling block configured for fluid communication with the radiator; and a liquid storage tank configured for fluid communication with the radiator and the cooling block, wherein the first and second passage are configured for fluid communication with the cooling block and the liquid storage tank, and operation of a computer housed within the computer case causes cooling liquid to enter the second passage of the radiator where the cooling liquid is cooled to release heat, and whereupon cooling liquid enters the first passage of the radiator for further cooling.

10. The integrated water cooling system of claim 9, wherein the cooling block includes at least a water inlet and a water outlet, and the liquid storage tank includes at least a water inlet and a water outlet.

11. The integrated water cooling system of claim 10, wherein the first passage is configured for fluid communication with the water outlet of the cooling block and the water inlet of the liquid storage tank, and the second passage is configured for fluid communication with the water outlet of the liquid storage tank and the water inlet of the cooling block.

12. The integrated water cooling system of claim 9, further comprising:

a first pipe;

a second pipe;

a third pipe; and a fourth pipe, wherein the first passage is configured for fluid communication with a water outlet of the cooling block via the fourth pipe and configured for fluid communication with a water inlet of the liquid storage tank via the first pipe, and the second passage is configured for fluid communication with a water outlet of the liquid storage tank via the second pipe and configured for fluid communication with a water inlet of the cooling block via the third pipe.

13. The integrated water cooling system of claim 9, wherein the liquid storage tank further comprises a water injection port.

14. The integrated water cooling system of claim 12, wherein during operation of the computer, the heat generated by the computer is transferred to the cooling liquid in the cooling block, and the cooling liquid enters the second passage of the radiator via the fourth pipe where the cooling liquid is cooled to release heat.

15. The integrated water cooling system of claim 14, wherein the cooling liquid enters the liquid storage tank via the first pipe for heat exchange with the cooling liquid in the liquid storage tank, whereupon the cooling liquid enters the first passage via the second pipe in which the cooling liquid is further cooled.

16. The integrated water cooling system of claim 15, wherein the cooling liquid returns to the cooling block via the third pipe.

17. The integrated water cooling system of claim 9, wherein the case includes an opening for a portion of the liquid storage tank to extend through and remain exposed outside the case.

* * * * *